United States Patent [19]
Gagliardi et al.

[11] Patent Number: 5,800,684
[45] Date of Patent: *Sep. 1, 1998

[54] PROCESS FOR THE IMPROVEMENT OF THE ABRASION RESISTANCE FEATURES AND OF THE CHEMICAL INERTIA OF TRANSPARENT THIN COATINGS

[75] Inventors: Giovanni Gagliardi, Conselice RA; Litterio Bolognese, Vasto CH, both of Italy

[73] Assignee: Società Italiana Vetro - SIV - S.p.A., Italy

[*] Notice: This patent issued on a continued prosecution application filed under 37 CFR 1.53(d), and is subject to the twenty year patent term provisions of 35 U.S.C. 154(a)(2).

[21] Appl. No.: 633,287

[22] Filed: Apr. 16, 1996

[30] Foreign Application Priority Data

Apr. 18, 1995 [IT] Italy ............... RM95A0244

[51] Int. Cl.$^6$ ............................................. C23C 16/34
[52] U.S. Cl. .................... 204/192.16; 204/192.22; 204/192.26; 427/165; 427/166; 427/255; 427/255.3; 427/255.7; 427/585
[58] Field of Search ............... 204/192.16, 192.22, 204/192.26; 427/165, 166, 255, 255.3, 255.7, 126.3, 585, 587

[56] References Cited

U.S. PATENT DOCUMENTS

| | | | |
|---|---|---|---|
| 4,639,069 | 1/1987 | Yatabe et al. | 350/1.7 |
| 4,769,291 | 9/1988 | Bellcino et al. | 428/630 |
| 4,898,774 | 2/1990 | Yamashita et al. | 428/336 |
| 5,110,637 | 5/1992 | Ando et al. | 428/34 |
| 5,411,794 | 5/1995 | Kawaguchi et al. | 428/216 |

FOREIGN PATENT DOCUMENTS

| | | |
|---|---|---|
| 0 331 201 | 9/1989 | European Pat. Off. . |
| 0 530 676 A3 | 3/1993 | European Pat. Off. . |
| 530676 | 8/1993 | European Pat. Off. . |

OTHER PUBLICATIONS

Database WPI Section Ch, Week 9349, Derwent Publications Ltd., London, GB; Class L01, AN 93-392426 XP002008862 & JP-A-05 294 674 (Central Glass Co Ltd), Nov. 9, 1993 (abstract).

Patent Abstracts of Japan, vol. 013, No. 515 (C–655), Nov. 17, 1989 & JP-A-01 208344 (Nippon Sheet Glass Co. Ltd.), Aug. 22, 1989 (abstract).

Patent Abstracts of Japan, vol. 015, No. 302 (C–0855), Aug. 2, 1991 & JP-A-03 112833 (Nippon Sheet Glass Co Ltd), May 14, 1991 (abstract).

Patent Abstracts of Japan, vol. 016, No. 496 (C–0995), Oct. 14, 1992 & JP-A-04 182329 (Nippon Sheet Glass Co Ltd), Jun. 29, 1992 (abstract).

Patent Abstracts of Japan, vol. 010, No. 371 (P–526), Dec. 11, 1986 & JP-A-61 165731 (Toyota Motor Corp), Jul. 26, 1986 (abstract).

*Primary Examiner*—Michael Lusignan
*Assistant Examiner*—Timothy Meeks
*Attorney, Agent, or Firm*—Wenderoth, Lind & Ponack, L.L.P.

[57] ABSTRACT

A process for improving the durability of a thin transparent coating deposited on a transparent substrate such as glass for controlling the spectrophotometric properties of said substrate, which consists of the deposition of one thin transparent layer of $ZrO_{2-x}$ or Zr transparent alloy oxides or a combination of transparent alloys containing $ZrO_{2-x}$, according to a physical vapor deposition method that could be the same as the one utilized for the deposition of the base coating, without considerably altering its spectrophotometric features.

6 Claims, No Drawings

PROCESS FOR THE IMPROVEMENT OF THE ABRASION RESISTANCE FEATURES AND OF THE CHEMICAL INERTIA OF TRANSPARENT THIN COATINGS

BACKGROUND OF THE INVENTION

1. Field of the Invention

The present invention relates to a process for the improvement of the durability of a thin transparent coating, made up of one or more thin layers deposited on a transparent substrate with the purpose of controlling the electromagnetic radiation in the spectrum range from 0.28 μm to 100 μm.

2. Description of the Prior Art

Products provided with superficial coatings (from now on called coating) made up of one or more thin layers which, thanks to their electromagnetic radiation and/or electric conductivity features, find increasing applications in fields such as, for example, automotive and architectural glass have been realized for years on an industrial basis by using different technologies; (by means of a physical vapor deposition: RF sputtering, magnetron sputtering, thermal evaporation, electron gun evaporation and by means of chemical vapor deposition: pyrolysis, cvd, sol-gel).

The origin of success of such products has a twofold nature. With coating application on transparent substrates (such as, for example, glass), the interference phenomena can be exploited, typical of the wave-like processes, in order to modify during the spectral visible range UV-VIS-NIR-FIR (that is from 0.28 μm to 100 μm) the substrate response when compared to the electromagnetic radiation affecting it, and arrange, if necessary, a base which is no longer electrically insulated. This allows simultaneous consideration of both the different aesthetic and chromatic needs, to realize products able to satisfy the numerous requests for solar control, energy savings (thermal transmission reduction), the improvement of the visual and environmental comfort in buildings and automobiles, the deterioration reduction of interior materials, surface defrosting, etc.

Naturally there exists a great difference between products present on the market, both on the basis of the durability and services features.

Furthermore the increasing development of glazings is separating in a clear-cut manner the products realized by the application of various technologies. So the coatings obtained by means of physical vapor deposition proved to be incompatible with some recent applications. In particular coatings, so-called reflective, based on the usage of materials such as for example Steel (SSt), Titanium (Ti), Chromium (Cr), Tin (Sn) and/or related oxides, nitrides and oxide nitrides are not generally suitable for use on ventilated panes (it deals with curtain walls realized with glass coated with coating, in particular monolithic glass and used more frequently in buildings). The reason for this is tied to the general problem of the long term instability of the coatings realized by physical vapor deposition when they are used directly in contact with the environment.

Similarly, in case of products intended for the automotive market, the reduced resistance features to the abrasion does not consent the installation as monolithic glass covered by a coating, particularly monolithic on movable parts (movable sunroofs, roll-down windows).

SUMMARY OF THE INVENTION

The scope of the present invention is that of overcoming such inconveniences. The invention, as characterized by the claims, solves the problem of the usage of glass provided with thin coatings applied by means of physical vapor deposition directly in contact with the environment, for example ventilated panes, and/or in severe abrasion conditions, for example as movable glazings for cars.

A further scope of the present invention is that of improving the durability of said coatings without considerably altering the spectrophotometric properties.

The present invention is based on the discovery that the abrasion resistance features and coating chemical inertia applied by physical vapor deposition utilizing materials such as, for example, SSt, (AISI 316 or similar), Ti, Cr, Sn, relative oxides, nitrides and/or oxide nitrides, can be improved by applying on them, continuously, an external protective layer having appropriate features.

The innovation deals with an overall general methodology that allows both the "brand new" design of new coatings, and the improvement of coatings already existing in the market. In both cases the disturbance introduced by the external protective film is reduced to the point that it can be considered inside the production tolerances.

It has surprisingly been found that a thin film made up of zirconium oxide, in particular $ZrO_{2-x}$ ($x<<1$), or formed by transparent alloy oxides containing Zr (such as Zr—Al, Zr—Ti, Zr—SSt, Zr—Cr) or formed by a combination of transparent oxides containing $ZrO_{2-x}$ deposited continuously on an underlying coating provides enough protection to pass the standardized durability tests fixed by the international standards that deal with abrasion resistance, to chemical attacks ($SO_2$, NaCl, etc.) and to atmospheric agents (condense) proving the advantage to utilize such coatings in contact with the environment and/or as parts in motion.

Furthermore it has surprisingly been found that the thickness of the protective layer deposited according to the process object of the present invention, such as to allow the wanted protection, turns out to be included between $2\times10^{-3}$ μm and $8\times10^{-10}$ μm.

A protective layer having such reduced thicknesses, does not on the one hand influence considerably on the main spectrophotometric properties of the underlying coating such as transmission (TUV) and ultraviolet reflection, the light transmission (TL) and energetic (TE), light reflection (RL) and energetic (RE), the dominating wave length $\lambda_D$, excitation purity (Pe), emissivity, on the other hand it can be easily deposited, for example with the magnetron sputtering method, on a traditional system used for coating architectural or automotive glass sheets.

It is therefore object of the present invention a process for the improvement of the durability of a thin transparent coating made up of one or more thin layers applied under vacuum by means of a well-known physical vapour deposition method on the surface of a transparent substrate with the purpose of controlling the electromagnetic radiation in the spectral range included between 0.28 μm and 100 μm characterized by the fact of applying on said coating continuously a dielectric protective transparent layer of zirconium oxide, in particular $ZrO_{2-x}$ ($x<<1$) or transparent oxides of Zr alloys or a combination of transparent oxides containing $ZrO_{2-x}$.

In accordance with the process described above, is also part of the present invention, a glass sheet having a protective layer applied on the base coating continuously, it consists of a $ZrO_{2-x}$ ($x<<1$) thin layer, or Zr alloys transparent oxides such as for example Zr—Al, Zr—Ti, Zr—SSt, Zr—Cr, or a combination of transparent oxides containing $ZrO_{2-x}$ and makes up an effective thicknesses barrier between $2 \times 10^{-3}$ μm and $8 \times 10^{-3}$ μm.

Layers having such thicknesses can be easily deposited, for example, by magnetron sputtering starting with Zr metal targets or with Zr alloys. In this case the sputtering will be of the reactive type, having its deposition in an appropriately oxidized environment so as to obtain a practically stoichiometric oxide (x<<1). It is emphasized that, as experts in the field well-know, other techniques, in addition to the magnetron sputtering, can be utilized to put into practice the present invention. Some examples are thermal evaporation, evaporation by electronic gun, RF sputtering.

The application of an additional film on an existing coating generally involves a variation of the characteristic parameters of the original coating which should not be neglected. For the case in question the protective layer according to the present invention implies a minimum variation of the characteristic parameters of the base coating. This matter is a direct consequence of the possibility to utilize the protective external layers according to the present invention very thin thicknesses that turn out to have a factor of $10^2$ below the wavelength of the visible radiation. This way the differences turn out to be almost independent from the coating to be protected (more precisely from the refraction index of the material that makes up the most external layer of the coating to be protected). Therefore such disturbance falls within the production tolerances in case the process object of the present invention wants to be used in order to improve the durability features of an item already in production.

The present invention allows improvement of resistance to abrasion features, chemical attack and the coating atmospheric agents for electromagnetic radiation control in the intervals UV-VIS-NIR-FIR (that is in the interval from 0.28 μm to 100 μm) minimizing also the variation of the main spectrophotometry characteristics such as transmission/ultraviolet reflection/luminous/energetic, dominant wave length, excitation purity, emissivity.

DESCRIPTION OF THE PREFERRED EMBODIMENTS

The characteristics of the invention will turn out to be more evident after considering the following examples of the invention, given merely as non-limiting examples.

The deposition system utilized is a classical magnetron sputtering system "G series" from AIRCO Inc. made up of three vacuum chambers and nine cathodes, able to coat glass sheets having a size up to $2100 \times 3210$ mm². In general before beginning the process the vacuum chambers are pumped down to reach a pressure below $5 \times 10^{-6}$ Torr. During sputtering, such value is preferably included between $1 \times 10^{-3}$ Torr and $5 \times 10^{-3}$ Torr. The power applied to the cathode is normally brought to a maximum (according to the size of the cathode and of the target material fusing point) to lower as much as possible the machine's cycle time.

Test sheets have been coated measuring $700 \times 700$ mm² and $2100 \times 3210$ mm².

EXAMPLE 1

In this comparative example the realization of a traditional $TiN_x$ coating and of the same product protected is described, according to the present invention, with $5 \times 10^{-3}$ μm of $ZrO_{2-x}$. The system has been equipped with six Ti targets in the first two coating zones, and with one Zr target on the third chamber.

Base product
Power = $6 \times 52$ KW
Pressure = 2μ $(N_2)$/2μ $(N_2)$/2μ $(N_2)$
[1μ=$1 \times 10^{-3}$ Torr]
Speed = 190 cm/minute
Protected product
Power = $6 \times 52 + 50$ KW
Pressure = 2μ $(N_2)$/2μ $(N_2)$/2μ $(O_2)$
[1μ=$1 \times 10^{-3}$ Torr]
Speed = 190 cm/minute

EXAMPLE 2

In this example a comparison is made between a traditional SSt (AISI 316) $TiN_x$ type coating and of the same product protected, according to the present invention, with $5.10^{-3}$ μm of $ZrO_{2-x}$. The system has been equipped with a SSt target in the first chamber, three Ti targets in the second coating zone, and one Zr target in the third chamber.

Base product
Power = $6+3 \times 55$ KW
Pressure = 2μ $(Ar)$/2μ $(N_2)$/2μ $(N_2)$
[1μ=$1 \times 10^{-3}$ Torr]
Speed = 228 cm/minute
Protected product
Power = $6+3 \times 55+65$ KW
Pressure = 2μ $(Ar)$/2μ $(N_2)$/2μ $(O_2)$
[1μ=$1 \times 10^{-3}$ Torr]
Speed = 228 cm/minute

EXAMPLE 3

In this comparative example the realization of a traditional $TiN_x$ coating and the same protected product is described, according to the present invention, with a $5 \times 10^{-3}$ μm thick $ZrO_{2-x}$ layer. The system has been equipped with three Ti targets in the second coating zone, and with one Zr target in the third chamber.

Base product
Power = $3 \times 40$ KW
Pressure = 2μ $(N_2)$/2μ $(N_2)$/2μ $(N_2)$
[1μ=$1 \times 10^{-3}$ Torr]
Speed = 210 cm/minute
Protected product
Power = $3 \times 40+60$ KW
Pressure = 2μ $(N_2)$/2μ $(N_2)$/2μ $(O_2)$
[1μ=$1 \times 10^{-3}$ Torr]
Speed = 210 cm/minute

EXAMPLE 4

In this example the realization of a traditional SSt (AISI 316)/$TiO_{2-x}$ type coating and of the same product protected is compared, according to the present invention, with a $5.10^{-3}$ μm layer of $ZrO_{2-x}$. The system has been equipped with a SSt target in the first chamber, two Ti targets in the second coating zone, and one Zr target in the third chamber.

Base product
Power = $6+2 \times 41$ KW
Pressure = 2μ $(Ar)$/2μ $(O_2)$/2μ $(N_2)$
[1μ=$1 \times 10^{-3}$ Torr]
Speed = 216 cm/minute Protected product
Power = 6+2×41+60 KW
Pressure = 2μ (Ar)/2μ (O$_2$)/2μ (O$_2$)
[1μ=1×10$^{-3}$ Torr]
Speed = 216 cm/minute The favorable level of durability reached with the solution which is object of the present invention (5000 cycles in the both cases mentioned above), the behavior has also been analyzed with a load of 0.09N/mm$^2$ which has given in the same way favorable results at 5000 cycles.

TABLE 1

SPECTROPHOTOMETER CHARACTERISTICS

| | | TRANSMISSION | | | | | REFLECTION GLASS SIDE | | | | REFLECTION FILM SIDE | | | |
|---|---|---|---|---|---|---|---|---|---|---|---|---|---|---|
| | | TUV [%] | TL [%] | λ$_D$ [nm] | Pe [%] | TE [%] | RLv [%] | λ$_D$ [nm] | Pe [%] | REv [%] | RLf [%] | λ$_D$ [nm] | Pe [%] | REf [%] |
| TiN$_x$(1) | TQ | 1.7 | 10.5 | 570 | 18.3 | 6.6 | 22.2 | 573 | 11.5 | 23.7 | 31.0 | 582 | 8.3 | 43.0 |
| | 50Å | 2.0 | 11.7 | 570 | 17.3 | 7.3 | 22.9 | 573 | 14.8 | 23.8 | 26.5 | 581 | 12.4 | 39.8 |
| SS/TiN$_x$ | TQ | 6.3 | 17.8 | 567 | 7.2 | 13.3 | 27.3 | 481 | 11.2 | 23.5 | 30.1 | 590 | 4.3 | 38.4 |
| | 50Å | 7.3 | 19.4 | 567 | 6.5 | 14.4 | 29.6 | 482 | 12.0 | 24.5 | 24.6 | 588 | 8.6 | 34.3 |
| TiN$_x$(2) | TQ | 15.8 | 42.8 | 573 | 10.3 | 34.3 | 9.3 | 478 | 25.5 | 8.6 | 21.7 | 476 | 12.7 | 23.7 |
| | 50Å | 17.5 | 45.1 | 573 | 9.8 | 36.4 | 12.4 | 479 | 25.2 | 10.1 | 19.8 | 478 | 13.0 | 21.2 |
| SS/TiO$_{2-x}$ | TQ | 24.4 | 43.3 | 492 | 1.2 | 38.3 | 7.6 | 479 | 6.0 | 6.6 | 19.0 | 577 | 3.5 | 19.4 |
| | 50Å | 25.7 | 45.0 | 490 | 1.5 | 39.6 | 8.9 | 478 | 10.5 | 7.4 | 17.1 | 577 | 5.8 | 18.0 |

TUV         ISO 9050
TL - RL - Pe - λ$_D$   CIE 1931 (ILL.C - 2°)
TE-RE       ISO 9050 (P. Moon - AM 2)

The results are shown on Table 1.

As shown on Table 1, for each different type the standard coatings have been considered (identified on the table with the initials TQ) and the same protected with a 5.10$^{-3}$ μm thick ZrO$_{2-x}$ (x<<1) layer. As shown by the measurements reported on this table, the variation of all spectrophotometry parameters are sufficiently reduced therefore the products are considered the same from the aesthetic and functional point of view.

In fact the variations, both in transmission and reflection, of the dominant wave length λ$_D$ are included in the range of ±2 nm and the variations of the TE energetic transmission are included within 2 points, therefore the competent man considers them to be included in the normal production tolerances.

Let's still remember that the application of the protective film object of the present invention does not alter in any way the emissivity value of the base coating, since, even though it deals with a dielectric type film, the relationship between the wavelength of the thermal radiation being considered and the thickness of the protective film is around 10$^3$.

The products then were subjected to the following normalized tests:

Abrasion test (EN1096) (Table 2)

The scope of this test is to simulate (utilizing equipment that permits application on the coating, by means of a normalized felt, a constant pressure for a fixed number of cycles during the straight-line forward/back motion at a 1 Hz frequency of the same felt) the coating deterioration following mechanical actions of the abrasive type similar to those undergone by the product ready for use, such as, for example, cleaning, leaching, washing, rubbing of the parts in rubber, etc.

There are two reference thresholds for the pair (N° of cycles, load), which correspond for example to the specifications supplied by the automobile manufactures for applications both inside and outside the automobile. Such values are respectively (200 cycles, 0.04N/mm$^2$) and (2000 cycles, 0.07N/mm$^2$).

TABLE 2

ABRASION TEST RESULTS (EN 1096)

| | | 0.04 N/mm$^2$ | | 0.07 N/mm$^2$ | 0.09 N/mm$^2$ |
|---|---|---|---|---|---|
| | | 300 cycles | 800 cycles | 5000 cycles | 5000 cycles |
| TiN$_x$(1) | TQ | RUINED | | | |
| | 50Å | | | GOOD | GOOD |
| SS/TiN$_x$ | TQ | RUINED | | | |
| | 50Å | | | GOOD | GOOD |
| TiN$_x$(2) | TQ | RUINED | | | |
| | 50Å | | | GOOD | GOOD |
| SS/TiO$_{2-x}$ | TQ | | | RUINED | |
| | 50Å | | | GOOD | GOOD |

NOTE
Visual opinions have been reported since the variation of the spectrophotometry parameters turned out to be irrelevant.
RUINED = almost total removal of the coating Kesternich test (DIN50018, EN1096) Table 3)

This test, fit for the behaviour evaluation of products exposed to highly polluted environments, consists in submitting the coating to repeated exposures into SO$_2$ saturated atmospheres.

As reference it is reminded that the CEN standardization for architectural applications (TC129 "Glass in buildings" WG6 "Coated glazings for windows") anticipates, in the specific case the use of external coating, the exceeding of a number of cycles equal to at 1/10 concentration of SO$_2$ when compared to the one utilized.

TABLE 3

KESTERNICH TEST RESULTS (40° C., 2S)
(DIN 50018, EN 1096)

| Duration | LIGHT TRANSMISSION | | | | | | LIGHT REFLECTION FILM | | | | | |
|---|---|---|---|---|---|---|---|---|---|---|---|---|
| | ΔY | | ΔC | | ΔE | | ΔY | | ΔC | | ΔE | |
| [days] | TQ | 50Å | TQ | 50Å | TQ | 50Å | TQ | 50Å | TQ | 50Å | TQ | 50Å |
| | | | | | $TiN_x$ (1) | | | | | | | |
| 1 | R | 0.23 | R | 0.16 | R | 0.37 | R | −0.42 | R | 0.02 | R | 0.42 |
| 2 | | 0.29 | | 0.10 | | 0.42 | | −0.39 | | 0.06 | | 0.38 |
| 3 | | 0.17 | | 0.12 | | 0.28 | | −0.02 | | 0.15 | | 0.15 |
| 4 | | 0.28 | | 0.16 | | 0.44 | | −0.56 | | 0.02 | | 0.55 |
| 5 | | 0.15 | | 0.13 | | 0.25 | | −0.06 | | 0.18 | | 0.19 |
| 6 | | 0.20 | | 0.16 | | 0.32 | | 0.02 | | 0.21 | | 0.21 |
| 12 | | | | | | | | | | | | |
| | | | | | $SSt/TiN_x$ | | | | | | | |
| 1 | 0.09 | 0.05 | 0.05 | 0.02 | 0.11 | 0.05 | 0.26 | 0.18 | 0.24 | 0.16 | 0.33 | 0.25 |
| 2 | R | −0.10 | R | 0.01 | R | 0.11 | R | 0.41 | R | 0.21 | R | 0.48 |
| 3 | | 0.03 | | 0.02 | | 0.04 | | 0.12 | | 0.1 | | 0.16 |
| 4 | | R | | R | | R | | R | | R | | R |
| 5 | | | | | | | | | | | | |
| 6 | | | | | | | | | | | | |
| 12 | | | | | | | | | | | | |
| | | | | | $TiN_x$ (2) | | | | | | | |
| 1 | 0.12 | −0.07 | 0.31 | 0.11 | 0.32 | 0.13 | 0.04 | 0.24 | 0.34 | 0.29 | 0.34 | 0.40 |
| 2 | R | −0.06 | R | 0.10 | R | 0.11 | R | 0.14 | R | 0.18 | R | 0.23 |
| 3 | | 0.05 | | 0.09 | | 0.10 | | 0.24 | | 0.31 | | 0.40 |
| 4 | | 0.13 | | 0.04 | | 0.10 | | 0.07 | | 0.13 | | 0.16 |
| 5 | | 0.29 | | 0.04 | | 0.22 | | −0.08 | | 0.03 | | 0.10 |
| 6 | | | | | | | | | | | | |
| 12 | | 0.38 | | 0.05 | | 0.24 | | −0.15 | | 0.06 | | 0.18 |
| | | | | | $SSt/TiO_{2-x}$ | | | | | | | |
| 1 | −0.07 | 0.05 | 0.04 | 0.05 | 0.06 | 0.06 | 0.11 | 0.12 | 0.12 | 0.10 | 0.18 | 0.17 |
| 2 | R | −0.07 | R | 0.08 | R | 0.10 | R | 0.27 | R | 0.22 | R | 0.40 |
| 3 | | −0.25 | | 0.04 | | 0.19 | | 0.29 | | 0.22 | | 0.41 |
| 4 | | −0.12 | | 0.02 | | 0.09 | | 0.07 | | 0.09 | | 0.12 |
| 5 | | −0.07 | | 0.04 | | 0.07 | | 0.16 | | 0.12 | | 0.23 |
| 6 | | | | | | | | | | | | |
| 12 | | 0.21 | | 0.04 | | 0.16 | | −0.56 | | 0.28 | | 0.73 |

R = RUINED (presence of small corrosion spots)

The parameters reported on the above mentioned table, that is ΔY, ΔC and ΔE, are related to the Lab-Hunter system and represent respectively the light transmission or reflection variation, the chromatic variation and the total color variation, when compared to the untreated sample (TQ).

The test results show that the TQ samples deteriorate within 1–2 days, while those protected (apart from a case where the deterioration takes place after 4 days) alterations cannot be distinguished not even after 6 or 12 days.

Condense test (EN1096) (Table 4)

With this test it is evaluated the possible deterioration of the product caused by condense water formed on the coating after processing.

Also in this case as a reference point the values provided by the CEN normalization (see above) can be used that, for external applications, anticipates 500 hrs of exposure at a temperature of a 40° C. (10° C. less when compared to the conditions used here).

The parameters reported on the above table, that is αY, αC and αE, are related to the Lab-Hunter system and represent respectively the light transmission or reflection variation, the chromatic variation or the total color variation, when compared to the untreated TQ sample.

TABLE 4

CONDENSE TEST RESULTS (50° C.)
(EN 1096)

| | dur. | LIGHT TRANSMISSION | | | | | | LIGHT RELECTION FILM | | | | | | LIGHT REFLECTION GLASS | | | | | |
|---|---|---|---|---|---|---|---|---|---|---|---|---|---|---|---|---|---|---|---|
| | | ΔY | | ΔC | | ΔE | | ΔY | | ΔC | | ΔE | | ΔY | | ΔC | | ΔE | |
| | [hrs.] | TQ | 50Å | TQ | 50Å | TQ | 50Å | TQ | 50Å | TQ | 50Å | TQ | 50Å | TQ | 50Å | TQ | 50Å | TQ | 50Å |
| $TiN_x(1)$ | 500 | 13.4 | 0.18 | 0.18 | 0.12 | 2.01 | 0.28 | −0.88 | 0.28 | 0.48 | 0.31 | 0.93 | 0.42 | 0.64 | −0.15 | 0.77 | 0.15 | 1.02 | 0.22 |
| | 1000 | R | 0.34 | R | 0.17 | R | 0.51 | R | −0.21 | R | 0.16 | R | 0.26 | R | −0.13 | R | 0.10 | R | 0.17 |
| | 1500 | | 0.39 | | 0.22 | | 0.59 | | −0.29 | | 0.20 | | 0.35 | | −0.21 | | 0.05 | | 0.23 |
| | 2000 | | 0.28 | | 0.16 | | 0.43 | | 0.39 | | 0.38 | | 0.54 | | −0.24 | | 0.19 | | 0.32 |
| | 2500 | | 0.40 | | 0.22 | | 0.61 | | −0.13 | | 0.23 | | 0.27 | | −0.29 | | 0.08 | | 0.32 |
| $SSt/TiN_x$ | 500 | 2.50 | −0.07 | 0.58 | 0.12 | 2.96 | 0.14 | −1.36 | 0.91 | 0.62 | 0.61 | 1.41 | 1.12 | −1.71 | −0.48 | 1.08 | 0.24 | 1.94 | 0.50 |
| | 1000 | R | 0.03 | R | 0.15 | R | 0.16 | R | 0.64 | R | 0.54 | R | 0.85 | R | −0.41 | R | 0.23 | R | 0.43 |
| | 1500 | | −0.02 | | 0.21 | | 0.21 | | 0.84 | | 0.75 | | 1.15 | | −0.53 | | 0.36 | | 0.60 |
| | 2000 | | 0.08 | | 0.15 | | 0.17 | | 0.41 | | 0.51 | | 0.67 | | −0.37 | | 0.23 | | 0.41 |
| | 2500 | | −0.02 | | 0.25 | | 0.26 | | 0.97 | | 0.78 | | 1.26 | | −0.63 | | 0.33 | | 0.67 |
| $TiN_x(2)$ | 500 | R | 0.10 | R | 0.30 | R | 0.31 | R | 0.28 | R | 0.58 | R | 0.66 | R | 0.44 | R | 0.05 | R | 0.63 |
| | 1000 | | 0.18 | | 0.38 | | 0.40 | | 0.26 | | 0.59 | | 0.65 | | −0.49 | | 0.06 | | 0.71 |
| | 1500 | | 0.28 | | 0.40 | | 0.45 | | 0.16 | | 0.61 | | 0.63 | | −0.43 | | 0.23 | | 0.65 |
| | 2000 | | 0.43 | | 0.32 | | 0.46 | | −0.02 | | 0.37 | | 0.37 | | −0.07 | | 0.11 | | 0.15 |
| | 2500 | | 0.32 | | 0.48 | | 0.54 | | 0.16 | | 0.66 | | 0.68 | | −0.40 | | 0.24 | | 0.62 |
| $SSt/TiO_{2-x}$ | 500 | 0.63 | 0.16 | 0.28 | 0.21 | 0.55 | 0.25 | 0.96 | 0.24 | 0.96 | 0.42 | 1.43 | 0.51 | −0.09 | −0.02 | 1.30 | 0.06 | 2.14 | 0.37 |
| | 1000 | R | 0.39 | R | 0.35 | R | 0.46 | R | 0.14 | R | 0.50 | R | 0.53 | R | −0.20 | R | 0.12 | R | 0.35 |
| | 1500 | | 0.50 | | 0.37 | | 0.53 | | 0.03 | | 0.62 | | 0.62 | | −0.26 | | 0.32 | | 0.54 |
| | 2000 | | 0.65 | | 0.46 | | 0.67 | | 0.21 | | 0.68 | | 0.73 | | −0.38 | | 0.05 | | 0.64 |
| | 2500 | | 0.72 | | 0.49 | | 0.73 | | 0.13 | | 0.81 | | 0.83 | | −0.41 | | 0.27 | | 0.73 |

R = RUINED (presence of colored spots and stripes)

The examination of the test results shows that TQ samples deteriorate after 1000 hours of tests, while those protected did not show any alteration even after 2500 hours.

We claim:

1. A process for the improvement of the durability of a transparent coating made up of one or more layers deposited on a surface of a transparent substrate, said transparent coating comprising a top layer consisting of stainless steel, titanium, chromium, their oxides, nitrides and/or oxide nitrides, said top layer being formed by physical vapor deposits and said transparent coating controlling the transparent substrate spectrophotometric properties with respect to radiation of wavelength from 0.28 μm to 100 μm, said process consisting essentially of a step of depositing only one transparent protective dielectric layer on said transparent coating, said protective dielectric layer consisting of zirconium oxide, or transparent oxides of zirconium alloys selected from the group consisting of zirconium-aluminum, zirconium-titanium, zirconium-stainless steel, and zirconium chromium alloys, and said protective dielectric film having a thickness in a range from $2\times10^{-3}$ μm to $8\times10^{-3}$ μm.

2. Process according to claim 1 in which said physical vapour deposition method is selected from the group consisting of a thermal evaporation method, electronic gun evaporation, and radio frequency sputtering.

3. The process according to claim 1, in which said transparent protective dielectric layer is deposited by magnetron sputtering.

4. The process according to claim 3, in which said magnetron sputtering is performed in an $O_2$ atmosphere at a predetermined pressure in the range from $1\times10^{-3}$ Torr to $5\times10^{-3}$ Torr, said pressure being effective to obtain a substantially stoichiometric Zr oxide.

5. The process according to claim 3, in which said transparent protective dielectric layer has a thickness of $5\times10^{-3}$ μm.

6. The process according to claim 1, in which said one or more layers for controlling the spectrophotometric properties of the transparent substrate with respect to a radiation in a spectrum range from 0.28 μm to 100 μm and said transparent protection dielectric layer are both deposited by magnetron sputtering, said transparent protective dielectric layer being deposited immediately after forming said one or more layers for controlling said spectrophotometric properties, in an in-line reactive sputtering system.

* * * * *